United States Patent
Hira et al.

(10) Patent No.: US 6,967,883 B2
(45) Date of Patent: Nov. 22, 2005

(54) SENSE AMPLIFIER WITH REDUCED DETECTION ERROR

(75) Inventors: Masayuki Hira, Ibaraki (JP); Takahiro Matsuzawa, Ibaraki (JP); Yoritaka Saitoh, Ibaraki (JP); Keisuke Takeo, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 10/624,814

(22) Filed: Jul. 22, 2003

(65) Prior Publication Data

US 2004/0257897 A1 Dec. 23, 2004

(30) Foreign Application Priority Data

Jul. 25, 2002 (JP) .................................... 2002-216855

(51) Int. Cl.[7] ................................................ G11C 7/00
(52) U.S. Cl. ...................... 365/205; 365/194; 365/203
(58) Field of Search ................................ 365/194, 203, 365/204, 205; 327/57

(56) References Cited

U.S. PATENT DOCUMENTS 5,539,691 A * 7/1996 Kozaru et al. ......... 365/189.05
5,724,292 A * 3/1998 Wada ....................... 365/207

* cited by examiner

Primary Examiner—Hoai Ho
(74) Attorney, Agent, or Firm—Texas Instruments Incorporated

(57) ABSTRACT

This invention provides a type of sense amplifier, a type of bit line circuit, a type of storage device, and a method for amplifying a read signal characterized by the fact that it has a small detection error of the read signal and has low power consumption. With bit lines (BL, BLZ) and input terminals (SA, SAZ) of the amplifier connected to each other by means of a CMOS switch circuit, as control signal ENN becomes high level, amplification of the read signal in the amplifier starts and, at the same time, the amplified signal is held. After a time delay determined by delay circuit U1 from the start of amplification of the read signal, control signal GEN1 and control signal GEN2 output from said delay circuit U1 are changed, and connection between the bit line and amplifier is cut off. Consequently, while the small potential difference at the start of amplification is kept by the current from the bit line, the amplification operation is carried out to a certain degree, and then the bit line is cut off from the amplifier. Consequently, a detection error in the read signal can hardly take place.

7 Claims, 4 Drawing Sheets

SENSE AMPLIFIER WITH REDUCED DETECTION ERROR

FIELD OF THE INVENTION

This invention pertains to a type of sense amplifier that amplifies the read signal output to the bit line of a storage device, a type of bit line circuit for processing the signal of the bit line, a type of storage device, and a method for amplifying the read signal output to the bit line. This invention especially pertains to a type of confinement type sense amplifier and the bit line circuit and storage device containing said confinement type sense amplifier, as well as a read signal amplification method using said confinement type sense amplifier.

BACKGROUND OF THE INVENTION

Usually, a prescribed voltage (precharge voltage) is applied before write and read on the bit line that transfers the data stored in RAM or another memory cell. The charge that is charged in the capacitive component of the bit line due to application of the precharge voltage is discharged in the process of write operation/read operation, and the fall in voltage of the bit line due to said discharge is used as a write signal or read signal in access to the memory cell.

In recent years, the storage capacity of memories has been on the rise, and loss in electric power due to charging/discharge of the bit line in company with write/read has become a major factor in hampering the efforts in lowering power consumption of large-capacity memories.

In order to suppress such power loss, it is necessary for the vibration amplitude due to charging/discharging of bit line to be as small as possible. A confinement type sense amplifier has been especially developed as a technology for suppressing the discharge current of a bit line in read operation.

FIG. 6 is a schematic block diagram illustrating the constitution of a conventional confinement type sense amplifier.

As shown in FIG. 6, a conventional sense amplifier is composed of p-type MOS transistor Qp3, p-type MOS transistor Qp4, and n-type MOS transistors Qn1–Qn3. An input to this sense amplifier is connected through p-type MOS transistor Qp1 and p-type MOS transistor Qp2 to bit line pair (BL, BLZ).

p-type MOS transistor Qp3 and n-type MOS transistor Qn1 are connected together in series, with node SA at the connection middle point, and their gates are both connected to node SAZ.

p-type MOS transistor Qp4 and n-type MOS transistor Qn2 are connected together in series, with node SAZ at the connection middle point, and their gates are both connected to node SA.

The sources of p-type MOS transistor Qp3 and p-type MOS transistor Qp4 are connected to power source line Vcc. The sources of n-type MOS transistor Qn1 and n-type MOS transistor Qn2 are connected through n-type MOS transistor Qn3 to ground line G.

Node SA is connected through p-type MOS transistor Qp1 to bit line BL. Node SAZ is connected through p-type MOS transistor Qp2 to bit line BLZ.

Sense control signal ENN is input to the gates of p-type MOS transistor Qp1, p-type MOS transistor Qp2, and n-type MOS transistor Qn3.

For the confinement type sense amplifier with the aforementioned constitution, first of all, while a read signal from the memory cell is output to the bit line pair (BL, BLZ), sense control signal ENN is set to a low level. As a result, p-type MOS transistor Qp1 and p-type MOS transistor Qp2 are ON, and n-type MOS transistor Qn3 is OFF. In this case, the read signal from bit line pair (BL, BLZ) is input to node SA and node SAZ. However, since n-type MOS transistor Qn3 is OFF, no discharge current flows from bit line pair (BL, BLZ) to ground line G.

Then, as sense control signal ENN is set to high level from low level, n-type MOS transistor Qn3 is turned from the OFF to the ON state, and power is supplied to the amplifier composed of p-type MOS transistor Qp3, p-type MOS transistor Qp4, n-type MOS transistor Qn1 and n-type MOS transistor Qn2. As a result, the small potential difference between node SA and node SAZ is amplified, one of node SA and node SAZ is pulled up to high level, while the other node is pulled down to low level, and, at the same time, the signal level is maintained. In this case, because p-type MOS transistor Qp1 and p-type MOS transistor Qp2 are turned from the ON to the OFF state at the same time, the discharge current flowing from bit line pair (BL, BLZ) to node SA and node SAZ is suppressed.

However, for the confinement type sense amplifier shown in FIG. 6, because amplification of the read signal is carried out by means of the difference in the minute charge amounts left at node SA and node SAZ after they are cut off from bit line pair (BL, BLZ), detection of the read signal is prone to failure. This is undesired.

FIG. 7 is a diagram illustrating change in the signals at node SA and node SAZ in the sense amplifier shown in FIG. 6.

When word line WL of the memory cell is activated (FIG. 7A), a voltage difference is generated corresponding to the stored data at node SA and node SAZ connected to the bit line pair (BL, BLZ). In the example shown in FIG. 7B, the level of node SA is higher than the level of node SAZ. In this state, when sense control signal ENN becomes high level at time t1 (FIG. 7C), the voltage difference between node SA and node SAZ is amplified, and, in normal operation, as indicated by the solid line in FIG. 7B, node SA becomes high level, and node SAZ becomes low level.

However, when the impedance of p-type MOS transistor Qp1 and p-type MOS transistor Qp2 rises in the period before start of amplification of the voltage difference, node SA and node SAZ enter a floating state. Consequently, as n-type MOS transistor Qn3 is turned ON, said potentials are pulled down to the ground level. In this case, when there is dispersion in the capacitive component, the threshold, and other characteristics of the transistors that form the sense amplifier, the potentials of node SA and node SAZ can be inverted. As a result, an error read signal indicated by the broken line in FIG. 7B is detected. This is undesired.

Although the confinement type sense amplifier can be used as a technology for reducing power consumption, when the power source voltage is lowered, the input voltage of the sense amplifier tends to become smaller. Consequently, the probability of generating said detection error becomes even higher. This is undesired.

The objective of this invention is to solve the aforementioned problems of the prior art by providing a type of sense amplifier that can reduce the detection error of the read signal, as well as a type of bit line circuit and storage device having said sense amplifier.

Another objective of this invention is to provide a method for amplifying a read signal characterized by the fact that it can reduce the detection error of the read signal.

SUMMARY OF INVENTION

In order to realize the aforementioned objectives, this invention provides a type of semiconductor storage device characterized by the fact that it has an amplifier that is activated corresponding to a control signal and amplifies the potential difference between a first node and a second node; a first switch circuit that is connected between one bit line and said first node and is controlled to the OFF state after activation of said amplifier; and a second switch circuit that is connected between the other bit line and said second node and is controlled to the OFF state after activation of said amplifier.

For the semiconductor storage device of this invention, while the bit line pair composed of said one bit line and said other bit line and the amplifier are connected to each other through the first switch circuit and second switch circuit, the amplifier is activated corresponding to the control signal, and the signal input from the bit line pair to said first node and second node through said first switch circuit and second switch circuit is amplified. At a prescribed time after start of amplification with the amplifier, the first switch circuit and second switch circuit are controlled to the OFF state, and connection between the bit line pair and amplifier is cut off.

Also, it may have a constitution in which said first switch circuit and said second switch circuit have a p-type MOS transistor and n-type MOS transistor connected together in parallel, and said p-type MOS transistor and n-type MOS transistor are controlled to the OFF state at the same time.

Because the signals applied on the gate terminals of a p-type MOS transistor and n-type MOS transistor vary to logic levels inverse to each other, the noise components due to these signal components cancel each other.

In the figures, 10 represents a memory cell array, 20 an address decoder, 30 a bit line signal processing unit, 40 a data input/output circuit, 50 a controller, Qp1–Qp20 a p-type MOS transistor, Qn1–Qn17 an n-type MOS transistor, U1 a delay circuit, U2 a NAND circuit, INV1–INV3 an inverter circuit, BUF1–BUF4 a buffer circuit, R1–R4 a resistor.

DESCRIPTION OF EMBODIMENTS

In the following, two embodiments of the invention will be explained.

First Embodiment

Figure 1:
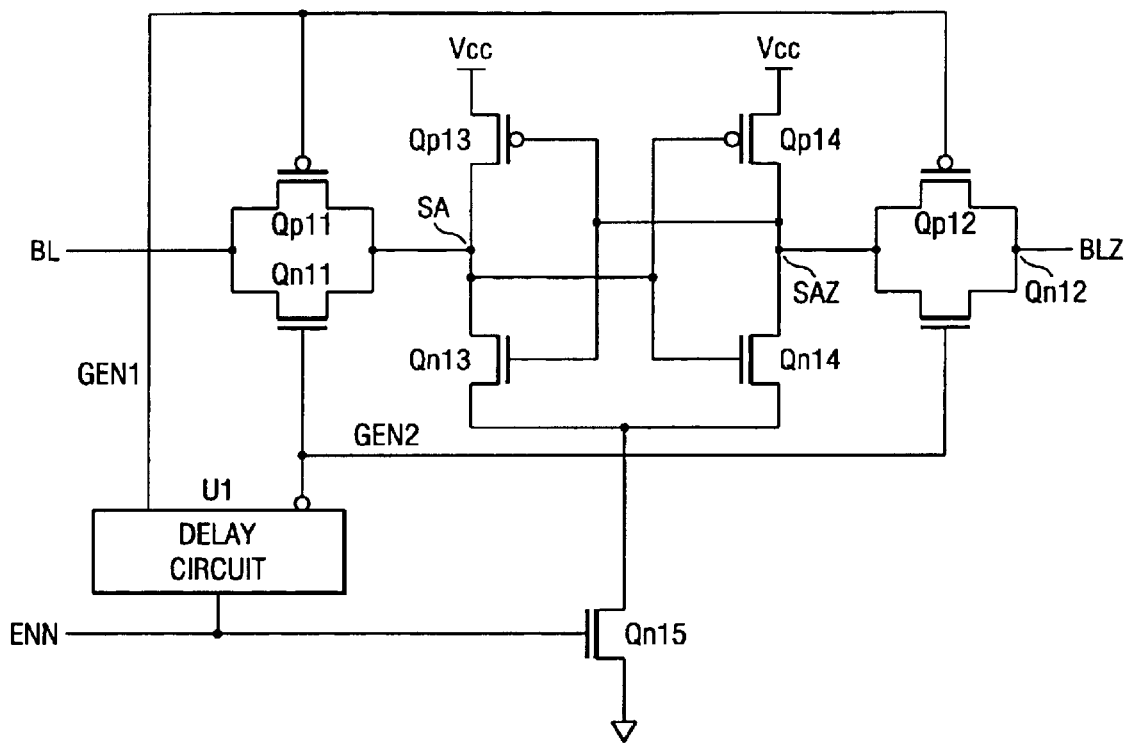
FIG. 1 is a schematic block diagram illustrating an example of constitution of the sense amplifier in the first embodiment of this invention.

FIG. 1 is a schematic block diagram illustrating an example of the constitution of the sense amplifier in the first embodiment in this invention.

The sense amplifier shown in FIG. 1 is composed of p-type MOS transistors Qp11–Qp14, n-type MOS transistors Qn11–Qn15, and delay circuit U1.

The unit containing p-type MOS transistor Qp11, n-type MOS transistor Qn11, p-type MOS transistor Qp12 and n-type MOS transistor Qn12 is an embodiment of the switch circuit of this invention.

The unit containing p-type MOS transistor Qp13, p-type MOS transistor Qp14, n-type MOS transistors Qn13–Qn15 is another embodiment of the amplifier of this invention.

Delay circuit U1 is an embodiment of the delay circuit of this invention.

First of all, explanation will be provided for the features pertaining to connection of the sense amplifier shown in FIG. 1.

p-type MOS transistor Qp13 and n-type MOS transistor Qn13 are connected in series, with node SA at the connection middle point, and their gates are both connected to node SAZ.

p-type MOS transistor Qp14 and n-type MOS transistor Qn14 are connected in series, with node SAZ at the connection middle point, and their gates are both connected to node SA.

The sources of p-type MOS transistor Qp13 and p-type MOS transistor Qp14 are connected to power source line Vcc. The sources of n-type MOS transistor Qn13 and n-type MOS transistor Qn14 are connected through n-type MOS transistor Qn15 to ground line G.

Node SA is connected through the parallel circuit of p-type MOS transistor Qp11 and n-type MOS transistor Qn11 to bit line BL. Node SAZ is connected through the parallel circuit of p-type MOS transistor Qp12 and n-type MOS transistor Qn12 to bit line BLZ.

Control signal GEN1 output from delay circuit U1 is input to the gates of p-type MOS transistor Qp11 and p-type MOS transistor Qp12. Control signal GEN2 output from delay circuit U1 is input to the gates of n-type MOS transistor Qn11 and n-type MOS transistor Qn12.

Sense control signal ENN is input to delay circuit U1 and the gate of n-type MOS transistor Qn15.

Delay circuit U1 outputs control signal GEN1 and control signal GEN2 obtained by delaying sense control signal ENN with a prescribed delay. Here, control signal GEN1 is a signal with the same logic as sense control signal ENN, while control signal GEN2 is a signal with logic inverted with respect to that of sense control signal ENN.

In the following, explanation will be provided for the operation of the sense amplifier with the aforementioned constitution shown in FIG. 1.

Figure 2:
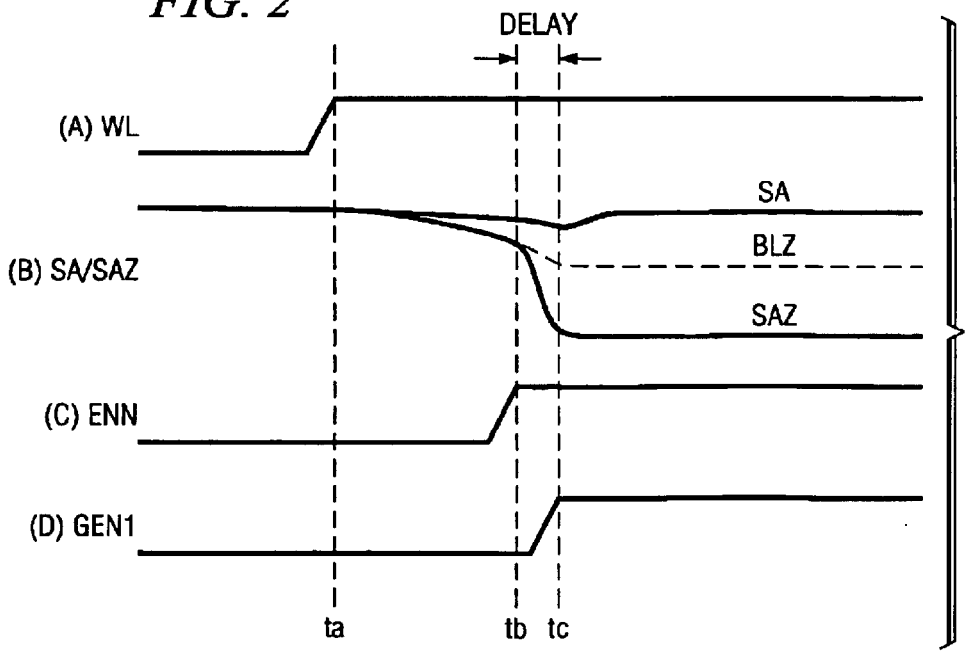
FIG. 2 is a diagram illustrating variation in the input signal to the amplifier in the sense amplifier shown in FIG. 1.

FIG. 2 is a diagram illustrating variation in the signals of node SA and node SAZ in the sense amplifier shown in FIG. 1.

Before operation of the sense amplifier, sense control signal ENN becomes low level, a low level signal is input to the gates of p-type MOS transistor Qp11 and p-type MOS transistor Qp12, a high level signal is input to n-type MOS transistor Qn11 and n-type MOS transistor Qn12, and all of these transistors are turned ON. Consequently, in this state, bit line BL is connected to node SA, and bit line BLZ is connected to node SAZ.

When word line WL of the memory cell is activated at time ta (FIG. 2A), a read signal is output from the memory cell to its bit line pair (BL, BLZ). As a result, a potential difference forms between node SA and node SAZ connected to bit line pair (BL, BLZ). In the example shown in FIG. 2B, the level at node SA is higher than that at node SAZ.

Figure 7:
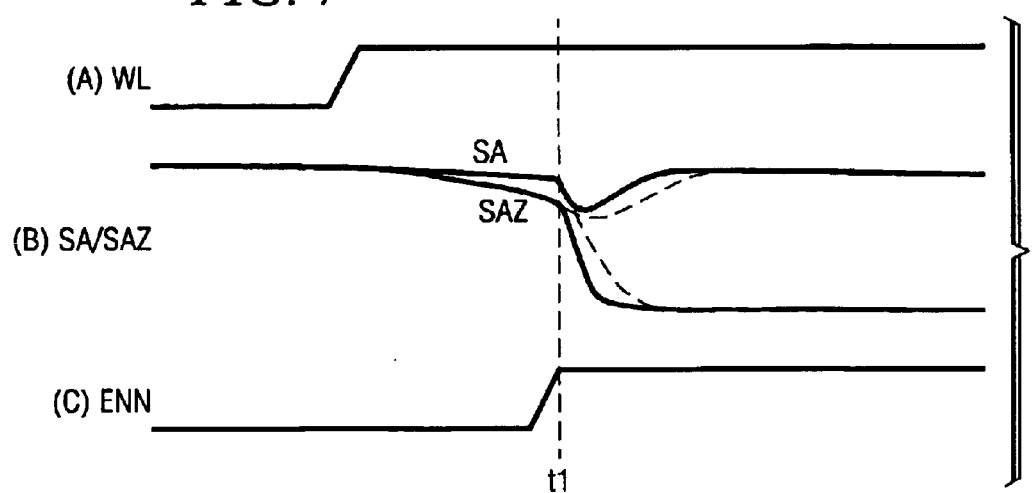
FIG. 7 is a diagram illustrating variation in the input signal of the sense amplifier shown in FIG. 6.

When sense control signal ENN turns from low level to high level at time ta, n-type MOS transistor Qn15 becomes ON, and the amplification operation starts, and amplification of the potential difference between node SA and node SAZ starts. At this time, since control signal GEN1 output from delay circuit U1 remains at a low level, and control signal GEN2 remains at a high level, node SA and bit line BL are connected to each other, and node SAZ and bit line BLZ are connected to each other. That is, at this time, node SA and node SAZ are connected through bit line pair (BL, BLZ) to the memory cell at a low impedance. Consequently, as shown in FIG. 7, a voltage fall does not take place for node SA and node SAZ, and the potential relationship between node SA and node SAZ is maintained. As amplification progresses while this potential relationship is maintained, the potential difference between node SA and node SAZ increases.

At time tc after a prescribed delay time from time ta, the output of delay circuit U1 changes, and p-type MOS transistor Qp11, p-type MOS transistor Qp12, n-type MOS transistor Qn11 and n-type MOS transistor Qn12 become OFF. As a result, node SA and node SAZ are cut off from bit line pair (BL, BLZ). However, at this time, the amplification operation is carried out sufficiently, and the potential difference between node SA and node SAZ becomes larger. Consequently, there is little variation in the node potential due to cut-off.

In this way, for the sense amplifier shown in FIG. 1, while a read signal from bit line pair (BL, BLZ) is input to amplifier (Qp13, Qn13, Qp14, Qn14, Qn15), after a prescribed delay time from the time of start of the amplification operation in the amplifier, connection between the amplifier and the bit line pair is cut off. Consequently, it is possible to perform an amplification operation while the potential relationship between node SA and node SAZ is kept before the amplifier and bit line pair are cut off from each other. As a result, the influence of dispersion in the capacitive component, the threshold, and other characteristics of the transistors that form the sense amplifier can be alleviated, and it is possible to correctly detect the read signal. Also, because the amplifier and memory cell are cut off from each other after a prescribed delay time, the steady current from the memory cell to the amplifier can be stopped, and the power consumption can be reduced.

Also, for the sense amplifier shown in FIG. 1, by means of the switch circuit having a p-type MOS transistor and n-type MOS transistor connected together in parallel, the bit line and the amplifier are connected to each other. Because control signal GEN1 and control signal GEN2 that drive said transistors have their phases reversed from each other, the noise components of control signal GEN1 and control signal GEN2 mixed through the parasitic capacitance of transistors at node SA and node SAZ have opposite signs. That is, the noise components due to control signal GEN1 and control signal GEN2 cancel each other. Consequently, mixing of noise components can be alleviated, and it is possible to detect the read signal more correctly.

Second Embodiment

In the following, explanation will be provided for the second embodiment of this invention.

A memory device using the sense amplifier disclosed in the first embodiment is realized by the second embodiment.

Figure 3:
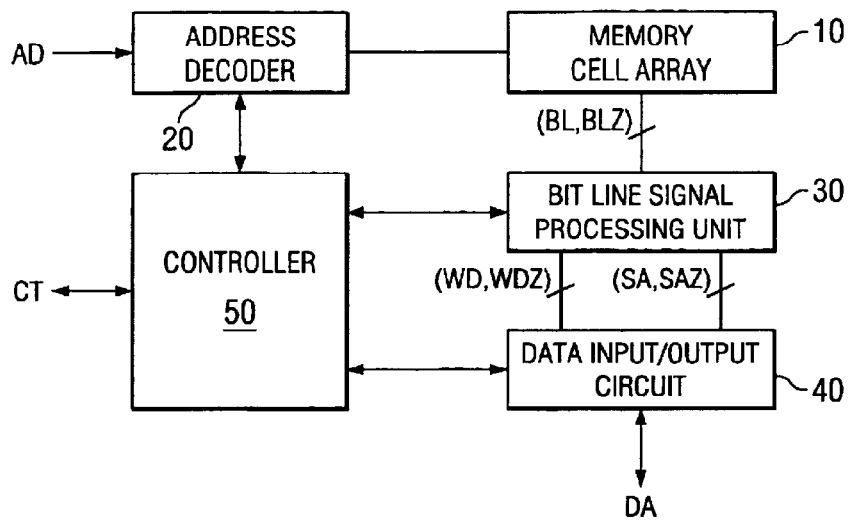
FIG. 3 is a schematic diagram illustrating an example of the constitution of the storage device in the second embodiment of this invention.

FIG. 3 is a schematic block diagram illustrating an example of constitution of the storage device in the second embodiment of this invention.

The storage device shown in FIG. 3 is a SRAM having memory cell array (10), address decoder (20), bit line signal processing unit (30), data input/output circuit (40), and controller (50).

Memory cell array (10) has plural memory cells connected to plural word lines WL and plural bit line pairs (BL, BLZ). Each memory cell allows access from bit line pair (BL, BLZ) as word line WL is activated.

Address decoder (20) activates a word line among plural word lines WL corresponding to input address data AD.

Bit line signal processing unit (30) is a unit that performs signal processing with respect to bit line pairs (BL, BLZ), such as application of precharge voltage, amplification of read signal, input of write signal, etc., for bit line pairs (BL, BLZ).

Said bit line signal processing unit (30) has plural bit line circuits each containing the same confinement type sense amplifier as shown in FIG. 1 corresponding to bit line pairs (BL, BLZ), respectively.

In the write operation, data input/output unit (40) holds the write data input from a data bus not shown in the figure in an internal latch circuit, while it outputs the data to the bit line circuit. In the read operation, the read data output from the bit line circuit are held in the internal latch circuit, while they are output to the data bus.

Corresponding to the input control signal, controller (50) controls address decoder (20), the bit line circuit, and data input/output circuit (40), and it executes the write/read operation.

Figure 4:
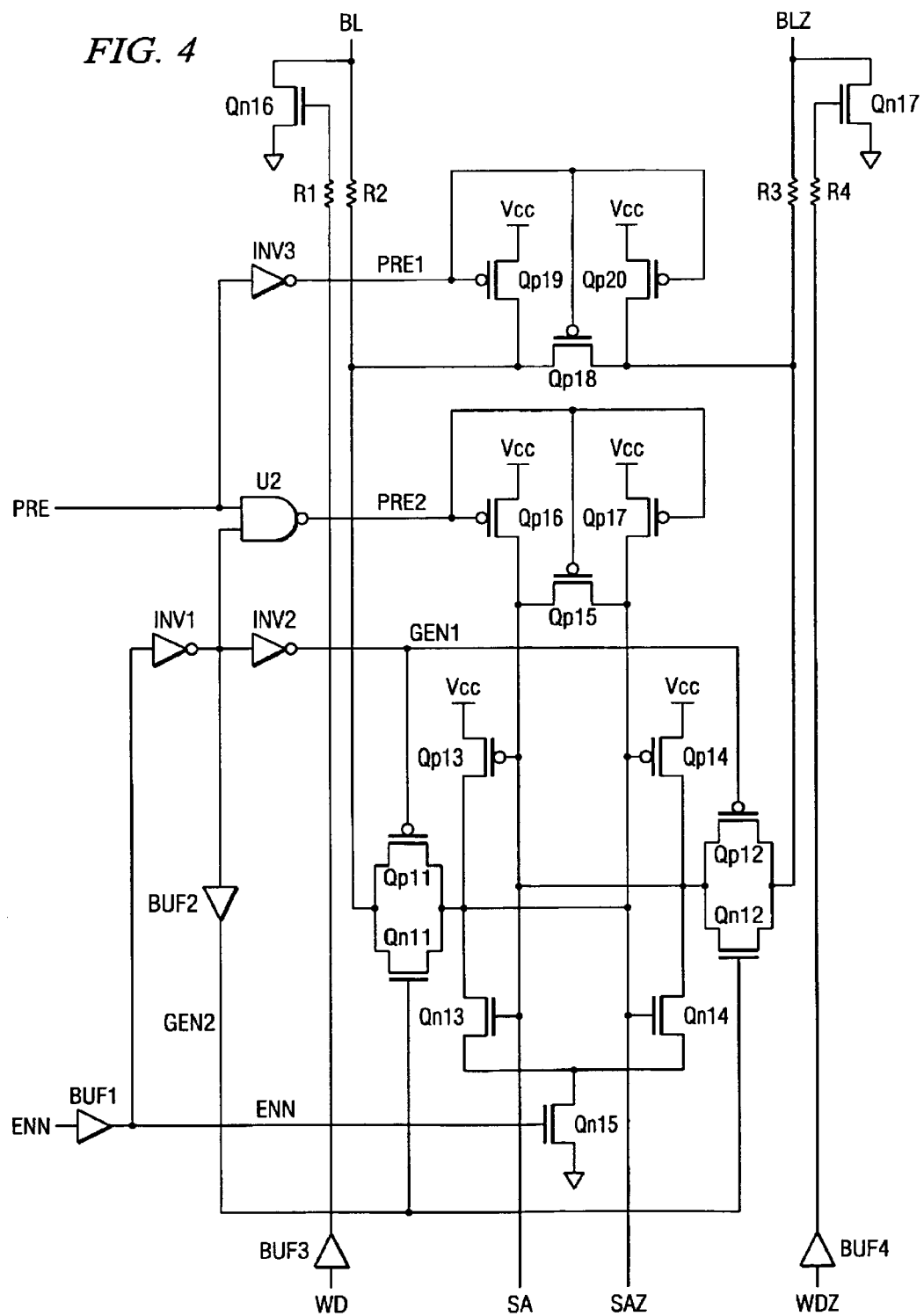
FIG. 4 is a schematic block diagram illustrating an example of constitution of the bit line circuit contained in bit line signal processing unit (30) shown in FIG. 3.
Figure 6:
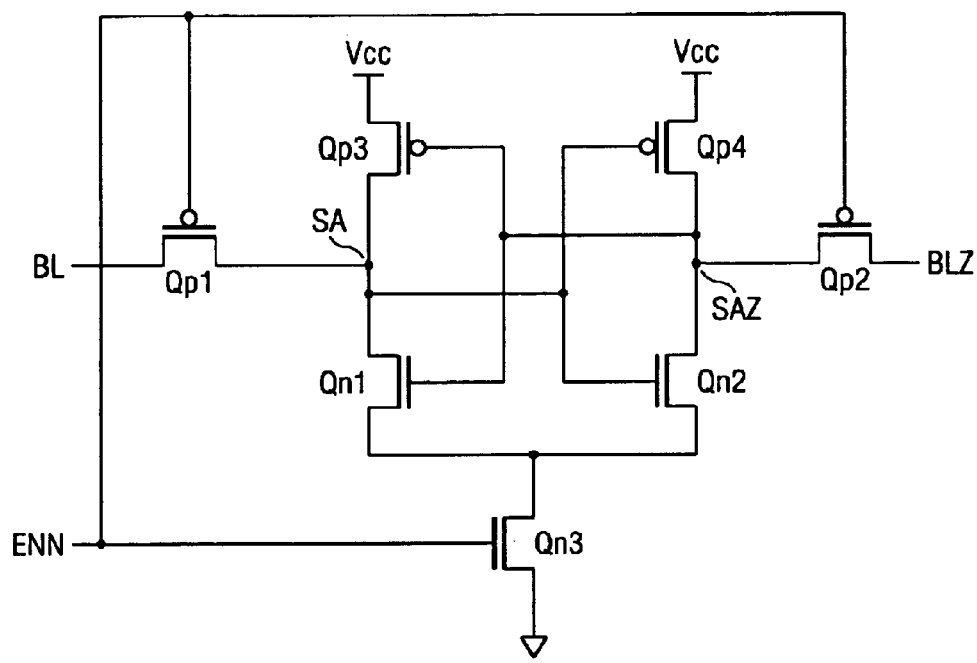
FIG. 6 is a schematic block diagram illustrating the constitution of a conventional confinement type sense amplifier.

FIG. 4 is a schematic block diagram illustrating an example of constitution of the bit line circuit contained in bit line signal processing unit (30) shown in FIG. 3.

The bit line circuit shown in FIG. 4 has p-type MOS transistors Qp11–Qp20, n-type MOS transistors Qn11–Qn17, inverter circuits INV1–INV3, resistors R1–R4, buffer circuits BUF1–BUF4, and NAND circuit U2.

Here, the same part numbers as those in FIG. 1 are adopted in FIG. 4.

Also, the unit containing inverter circuit INV1, inverter circuit INV2, and buffer circuit BUF2 shown in FIG. 4 is an embodiment of the delay circuit of this invention.

The unit containing p-type MOS transistors Qp18–Qp20 is an embodiment of the first charging circuit in this invention.

The unit containing p-type MOS transistors Qp15–Qp17 is an embodiment of the second charging circuit in this invention.

First of all, explanation will be provided for the features pertaining to connection of the bit line circuit shown in FIG. 4.

However, since the features pertaining to connection of p-type MOS transistors Qp11–Qp14 and n-type MOS transistors Qn11–Qn15 are the same as those for the sense amplifier shown in FIG. 1, they will not be repeated.

Node SA is connected through p-type MOS transistor Qp16 to power source line Vcc, and node SAZ is connected through p-type MOS transistor Qp17 to power source line Vcc. Also, p-type MOS transistor Qp15 is connected between node SA and node SAZ.

Bit line BL is connected through p-type MOS transistor Qp19 to power source line Vcc, and bit line BLZ is connected through p-type MOS transistor Qp20 to power source line Vcc. Also, p-type MOS transistor Qp18 is connected between bit line BL and bit line BLZ.

Write signal WD input from data input/output circuit (40) is input through buffer circuit BUF3 and resistor R1 to the gate of n-type MOS transistor Qn16. n-type MOS transistor Qn16 is connected between bit line BL and ground line G. Resistor R2 is inserted onto bit line BL between n-type MOS transistor Qn16 and p-type MOS transistor Qp19.

Write signal WDZ input from data input/output circuit (40) is a signal inverted in logic from write signal WD, and it is input through buffer circuit BUF4 and resistor R4 to the gate of n-type MOS transistor Qn17. n-type MOS transistor Qn17 is connected between bit line BLZ and ground line G. Resistor R3 is inserted into bit line BLZ between n-type MOS transistor Qn17 and p-type MOS transistor Qp20.

Sense control signal ENN is input to input buffer circuit BUF1, and its output signal is input to the gate of n-type MOS transistor Qn15 and inverter circuit INV1.

The output signal of inverter circuit INV1 is input to inverter circuit INV2, buffer circuit BUF2, and one input of NAND circuit U2.

Control signal GEN1 output from inverter circuit INV2 is input to the gates of p-type MOS transistor Qp11 and p-type MOS transistor Qp12. Control signal GEN2 output from buffer circuit BUF2 is input to the gates of n-type MOS transistor Qn11 and n-type MOS transistor Qn12.

Precharge control signal PRE is input to the other input of NAND circuit U2, and its output signal PRE2 is input to the gates of p-type MOS transistors Qp15–Qp17.

Precharge control signal PRE is also input to inverter circuit INV3, and its output signal PRE1 is input to the gates of p-type MOS transistors Qp18–Qp20.

In the following, explanation will be provided for the operation of the storage device shown in FIGS. 3 and 4.

In the case of data write, by means of controller (50), precharge control signal PRE is set on low level, and p-type MOS transistors Qp18–Qp20 are turned OFF. In this state, the word line connected to the memory cell as the object of write is activated, and, corresponding to the write data, one of write signal WD and write signal WDZ becomes high level. As a result, one of n-type MOS transistor Qn16 and n-type MOS transistor Qn17 is turned ON, and one of bit line BL and bit line BLZ is short circuited to ground line G, and the state of the signal level is kept in the memory cell.

Figure 5:
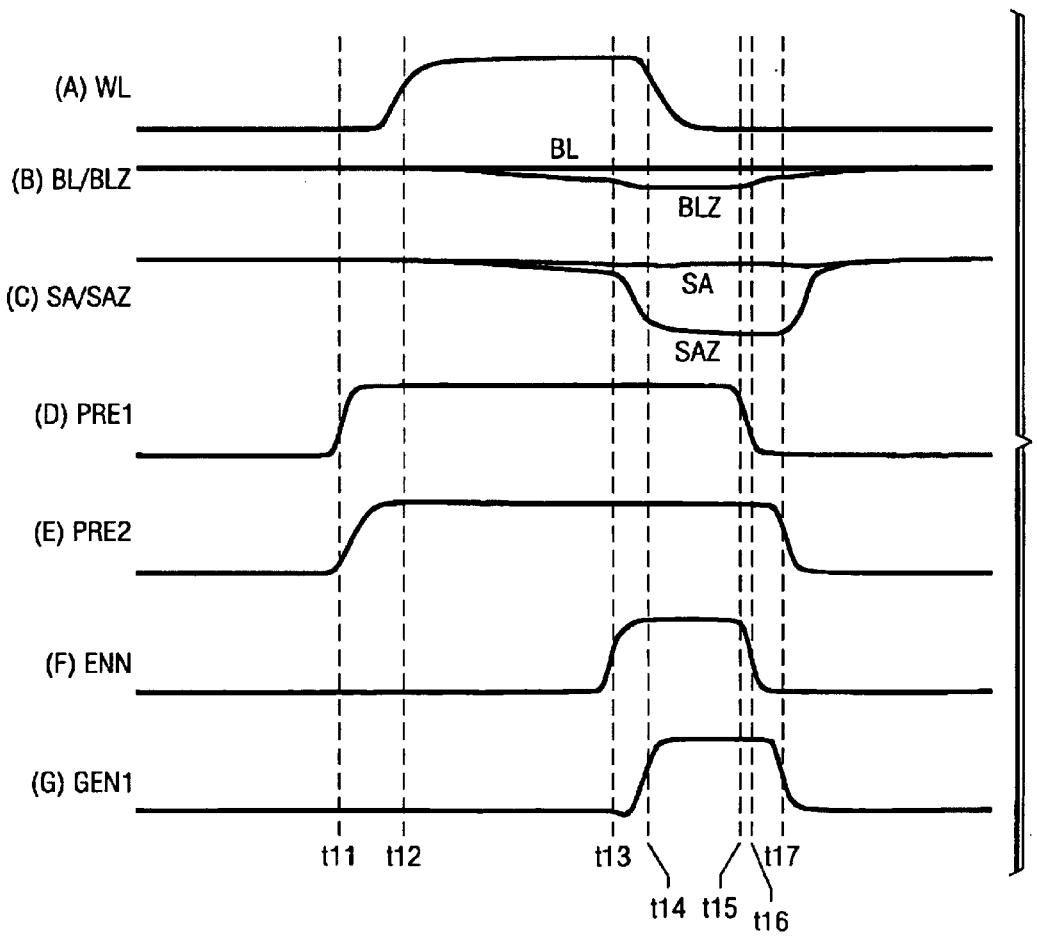
FIG. 5 is a diagram illustrating an example of the signal waveform of the bit line circuit shown in FIG. 4 in a read operation.

FIG. 5 is a diagram illustrating an example of the signal waveform of the bit line circuit shown in FIG. 4 in read operation.

Before the read operation, by means of controller (50), precharge control signal PRE is set on high level, sense control signal ENN is set on low level, and both control signal PRE1 and control signal PRE2 become low level (FIGS. 5D, 5E). As a result, p-type MOS transistors Qp15–Qp20 become ON, and node SA and node SAZ as well as bit line pair (BL, BLZ) are precharged to power source line Vcc (FIGS. 5B, 5C).

In this case, sense control signal ENN becomes low level, a low level signal is input to the gates of p-type MOS transistor Qp11 and p-type MOS transistor Qp12, a high level signal is input to the gates of n-type MOS transistor Qn11 and n-type MOS transistor Qn12, and both of these transistors become ON. Consequently, node SA is connected to bit line BL, and node SAZ is connected to bit line BLZ.

At time t11, as precharge control signal PRE changes from high level to low level, control signal PRE1 and control signal PRE2 become high level, and p-type MOS transistors Qp15–Qp20 become OFF.

At time t12, as word line WL connected to the memory cell as the read object is activated, a voltage difference corresponding to the stored data is generated on its bit line pair (BL, BLZ) (FIG. 5B). Also, a voltage difference is also generated at node SA and node SAZ connected to bit line pair (BL, BLZ) (FIG. 5C).

At time t13, as sense control signal ENN is set to high level (FIG. 5F), n-type MOS transistor Qn15 becomes ON and the amplification operation starts, and amplification of the potential difference between node SA and node SAZ starts. At this time, control signal GEN1 output from inverter circuit INV2 is kept at low level without change due to delay by means of inverter circuit INV1 and inverter circuit INV2 (FIG. 5G), and control signal GEN2 is also kept at high level due to delay by means of inverter circuit INV1 and buffer circuit BUF2. Consequently, node SA and bit line BL maintain connection, and node SAZ and bit line BLZ also maintain connection. That is, at this time, node SA and node SAZ are connected through bit line pair (BL, BLZ) to the memory cell at a low impedance. Consequently, no voltage drop takes place for node SA and node SAZ, and their relative potentials are maintained. With said relative potentials maintained, amplification takes place, and the potential difference between node SA and node SAZ becomes larger.

At time t14 after a prescribed delay time from time t13, control signal GEN1 changes to high level, control signal GEN2 changes to low level, and p-type MOS transistor Qp11, p-type MOS transistor Qp12, n-type MOS transistor Qn11 and n-type MOS transistor Qn12 become OFF. As a result, node SA and node SAZ are cut off from bit line pair (BL, BLZ). At this time, an amplification operation is readily carried out, and the potential difference between node SA and node SAZ becomes larger. Consequently, there is little variation in the node potential due to cutoff.

After that, the read signal output as the potential difference between node SA and node SAZ from the sense amplifier is kept in a latch circuit not shown in the figure of data input/output unit (40).

After the read signal is held in data input/output unit (40) and the word line returns to the non-active state (FIG. 5A), precharge control signal PRE changes from low level to high level. As a result, at time t15, control signal PRE1 changes from high level to low level, and bit line pair (BL, BLZ) is precharged to power source line Vcc again (FIG. 5B).

At time t16, as sense control signal ENN is set to low level, n-type MOS transistor Qn15 becomes OFF, and node SA and node SAZ are cut off from both power source line Vcc and ground line G, and they enter a floating state.

At time t17 after a prescribed delay time from time t16, control signal PRE2 changes from high level to low level, and node SA and node SAZ are precharged to power source line Vcc. Also, after a prescribed delay time from time t16 (time t17 in the example shown in FIG. 5), control signal GEN1 changes to low level, control signal GEN2 changes to high level, and node SA and node SAZ are connected to bit line pair (BL, BLZ). At this time, the operation stops for the amplifier (Qp13, Qn13, Qp14, Qn14, Qn15), and node SA and node SAZ enter a floating state. Consequently, no through-current flows from power source line Vcc via node SA and node SAZ to ground line G.

For the storage device shown in FIGS. 3 and 4, because the same type of sense amplifier as that in FIG. 1 is contained in the bit line circuit, the influence of dispersion in the capacitive component, the threshold, and other characteristics of transistors that form the sense amplifier is alleviated, and the read signal can be detected correctly. Also, because the amplifier is cut off from the memory cell after a prescribed time delay, a steady current from the memory cell to the amplifier is stopped, and it is possible to lower the power consumption. In addition, because the noise components due to control signal GEN1 and control signal GEN2 cancel each other, mixing of the noise components from said control signals for node SA and node SAZ is alleviated, and it is possible to detect the read signal more correctly.

In addition, because the delay circuit (INV1, INV2, BUF2) that determines the time difference between the sensing operation and confinement operation of the sense amplifier is set individually in the sense amplifier of each bit line circuit, the influence of dispersion in the characteristics of the transistors and the influence of delay due to detour of wiring can be alleviated, and it is possible to form the delicate time difference at high stability.

This invention is not limited to the aforementioned embodiments.

For example, by forming a preparatory form of transistors that form the delay circuit beforehand on a semiconductor substrate, and changing the circuit constitution of the delay circuit later in the stage of formation of wiring of a metal layer, it is possible to change the delay time of the delay circuit corresponding to the degree of dispersion of the circuit characteristics due to factors in the manufacturing process. As a result, it is possible to minimize the delay time while reducing the detection error of the read signal. Consequently, it is possible to reduce the charge flow from the memory cell to the sense amplifier during the delay time, and it is thus possible to lower the power consumption.

Transistors used in this invention are not limited to MOS transistors. Other types of transistors may also be used to realize this invention.

According to this invention, it is possible to reduce the detection error of a read signal while using a confinement type sense amplifier. As a result, it is possible to reduce the read error of memory data, and, at the same time, to lower the power consumption of the storage device.

What is claimed is:

1. A semiconductor storage device comprising:

an amplifier that is activated corresponding to a control signal and amplifies the potential difference between a first node and a second node;

a first switch circuit that is connected between a first bit line and said first node and is controlled to the OFF state after activation of said amplifier;

a second switch circuit that is connected between a second bit line and said second node and is controlled to the OFF state after activation of said amplifier; and a delay circuit that outputs said control signal with a prescribed delay time and, by means of an output signal of said delay circuit, said first switch circuit and said second switch circuit are controlled to be OFF.

2. The semiconductor storage device of claim 1, wherein said first switch circuit and said second switch circuit have a p-type MOS transistor and an n-type MOS transistor coupled together in parallel, and said p-type MOS transistor and n-type MOS transistor are controlled to be OFF at the same time.

3. The semiconductor storage device of claim 1, wherein said amplifier has a first inverter coupled between said second node and said first node, a second inverter coupled between said first node and said second node, and a switching element that responds to said control signal and couples said first inverter and said second inverter to a power source.

4. The semiconductor storage device of claim 1, further comprising a first charging circuit which is coupled to said first bit line and said second bit line and which charges said first bit line and said second bit line to a prescribed potential.

5. The semiconductor storage device of claim 4, further comprising a second charging circuit which is coupled to said first node and said second node and which charges said first node and said second node to a prescribed potential.

6. The semiconductor storage device of claim 5, wherein the charging operation of said first charging circuit and said second charging circuit comes to an end before activation of said amplifier.

7. The semiconductor storage device of claim 5, further comprising a first data write circuit coupled to said first bit line and a second data write circuit coupled to said second bit line.

* * * * *